US011164772B2

(12) United States Patent
Felix et al.

(10) Patent No.: US 11,164,772 B2
(45) Date of Patent: Nov. 2, 2021

(54) SPACER-DEFINED PROCESS FOR LITHOGRAPHY-ETCH DOUBLE PATTERNING FOR INTERCONNECTS

(71) Applicant: International Business Machines Corporation, Armonk, NY (US)

(72) Inventors: Nelson Felix, Slingerlands, NY (US); Ekmini Anuja De Silva, Slingerlands, NY (US); Luciana Meli Thompson, Albany, NY (US); Yann Mignot, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 101 days.

(21) Appl. No.: 16/174,666

(22) Filed: Oct. 30, 2018

(65) Prior Publication Data

US 2020/0135542 A1    Apr. 30, 2020

(51) Int. Cl.
*H01L 21/768* (2006.01)
*H01L 21/027* (2006.01)
(Continued)

(52) U.S. Cl.
CPC .... *H01L 21/76802* (2013.01); *H01L 21/0274* (2013.01); *H01L 21/0332* (2013.01);
(Continued)

(58) Field of Classification Search
CPC ........... H01L 21/76802; H01L 21/0274; H01L 21/0332; H01L 21/0337; H01L 21/31051; H01L 21/31144
See application file for complete search history.

(56) References Cited

U.S. PATENT DOCUMENTS 6,046,108 A * 4/2000 Liu .................... H01L 21/7684
257/E21.583
9,748,251 B1    8/2017 Ogino
(Continued)

FOREIGN PATENT DOCUMENTS

JP      2014056864      3/2014

OTHER PUBLICATIONS

Tseng et al., "Process Capability Comparison between LELE DPT and Spacer for NAND Flash 32nm and below," International Society for Optics and Photonics, In Proc. Lithography Asia, 2008, vol. 7140, pp. 714035-1 to 714035-11, 11 pages.

*Primary Examiner* — Kyoung Lee
*Assistant Examiner* — Christina A Sylvia
(74) *Attorney, Agent, or Firm* — Amin, Turocy & Watson, LLP

(57)    ABSTRACT

One or more embodiments described herein include systems, and/or methods that facilitate fabrication of a semiconductor device using a spacer lithography-etch process. According to an embodiment, a method can comprise performing a first lithography exposure and etch over a first layer of a semiconductor device, where the first lithography exposure and etch comprises forming one or more mandrels on a first region of a second layer by employing a first photoresist layer. The method can further comprise forming one or more spacers on a sidewall of the one or more mandrels and covering a second region of the second layer, where the second region is adjacent to the one or more mandrels. The method can further comprise forming a cut over a third region of the second layer and filling the third region with first material.

8 Claims, 13 Drawing Sheets

(51) Int. Cl.
*H01L 21/033* (2006.01)
*H01L 21/3105* (2006.01)
*H01L 21/311* (2006.01)

(52) U.S. Cl.
CPC .... *H01L 21/0337* (2013.01); *H01L 21/31051* (2013.01); *H01L 21/31144* (2013.01)

(56) References Cited

U.S. PATENT DOCUMENTS

| | | |
|---|---|---|
| 9,934,970 B1* | 4/2018 | Burns ............... H01L 21/76816 |
| 9,911,604 B1 | 11/2018 | Sun et al. |
| 2009/0181534 A1* | 7/2009 | Dimitrakopoulos ........................ H01L 21/76835 438/618 |
| 2014/0054756 A1 | 2/2014 | Hyatt et al. |
| 2014/0273442 A1 | 9/2014 | Liu et al. |
| 2015/0145070 A1 | 5/2015 | Song et al. |
| 2016/0020100 A1 | 1/2016 | Huang et al. |
| 2017/0092506 A1* | 3/2017 | deVilliers ......... H01L 21/31144 |

* cited by examiner

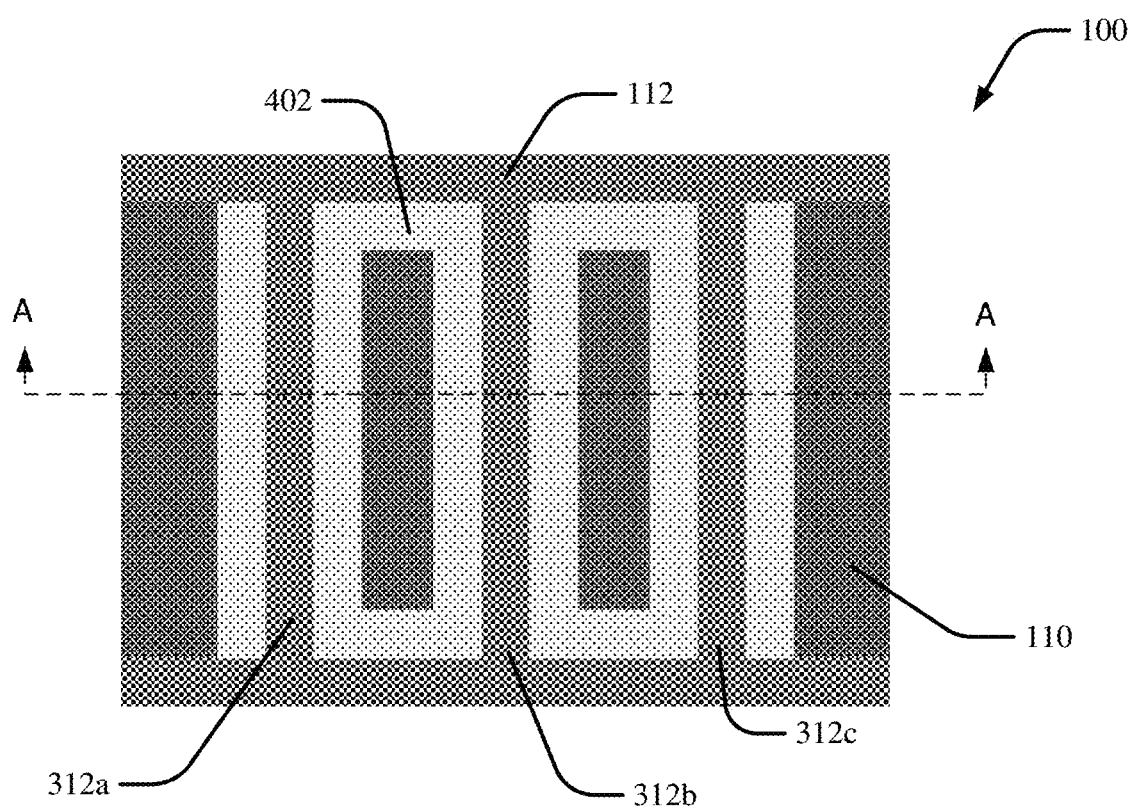
FIG. 4A
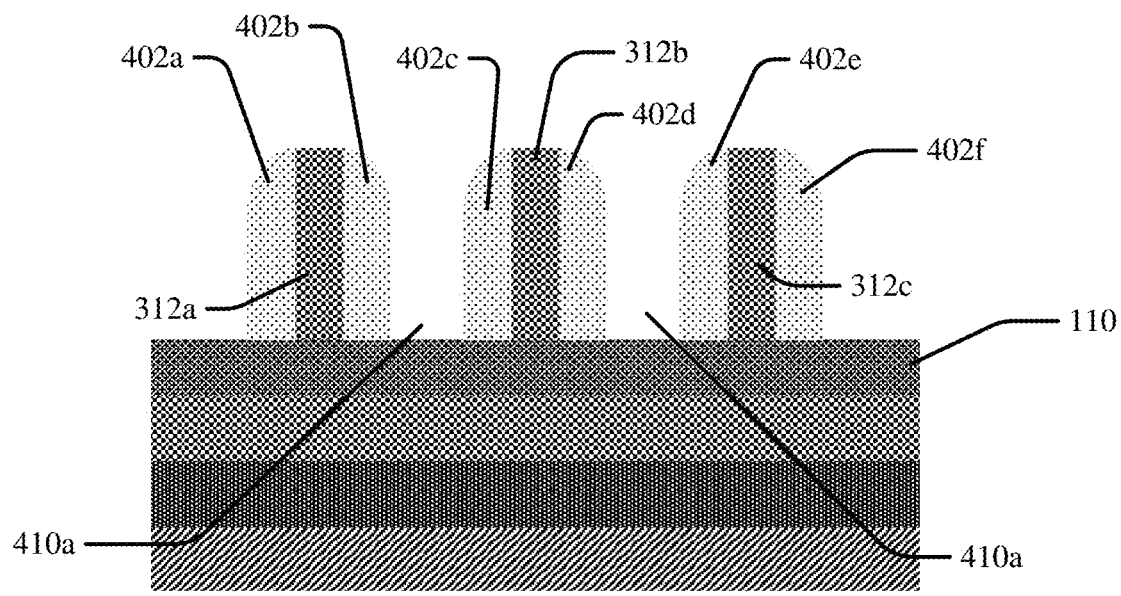
FIG. 4B
FIG. 4

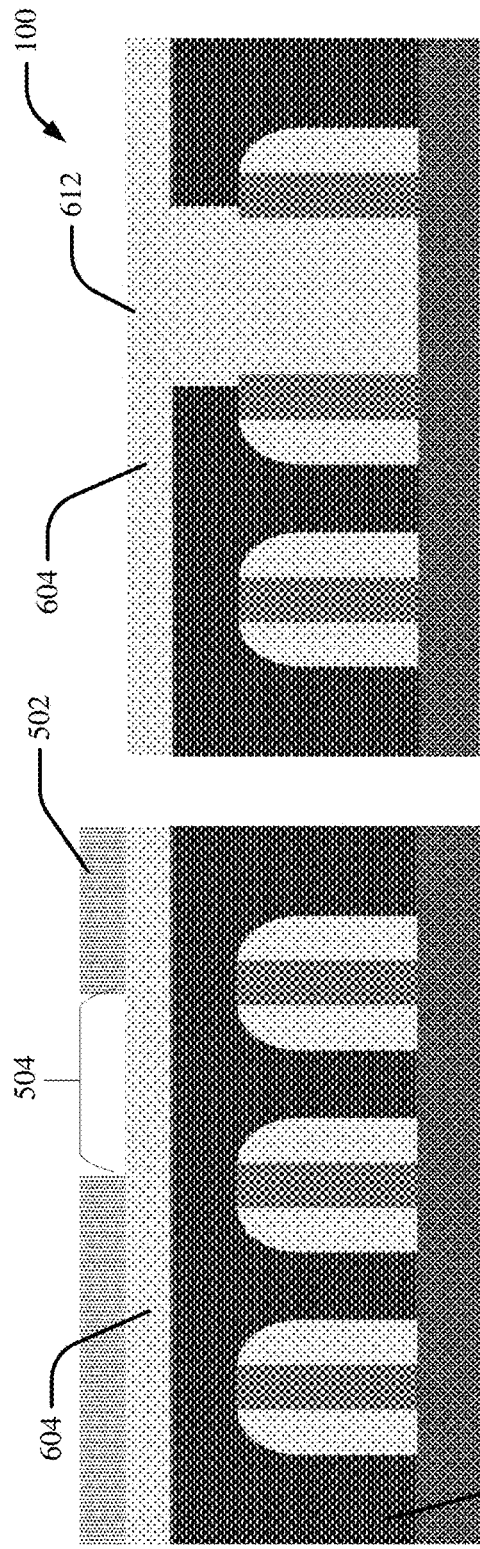
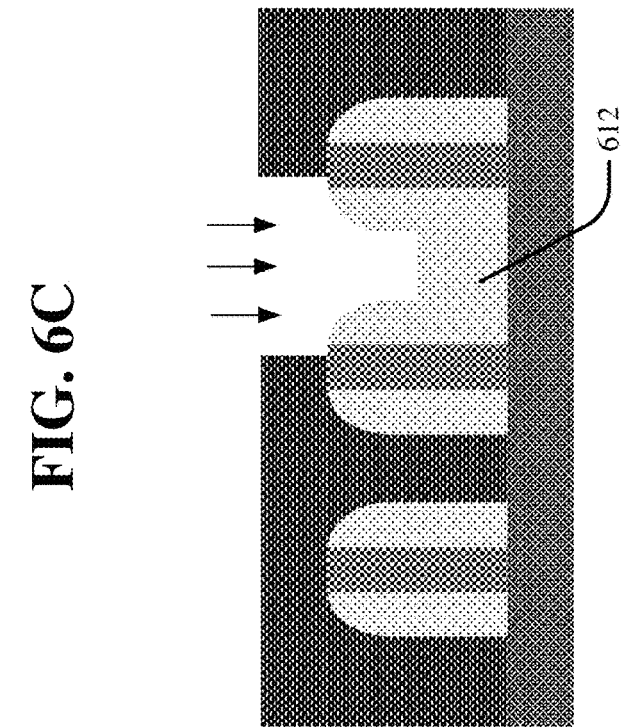
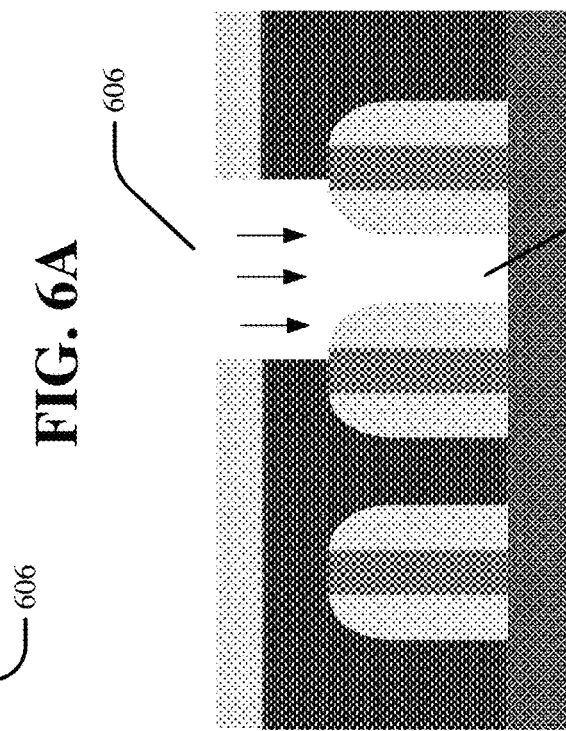
FIG. 6A  FIG. 6B  FIG. 6C  FIG. 6D

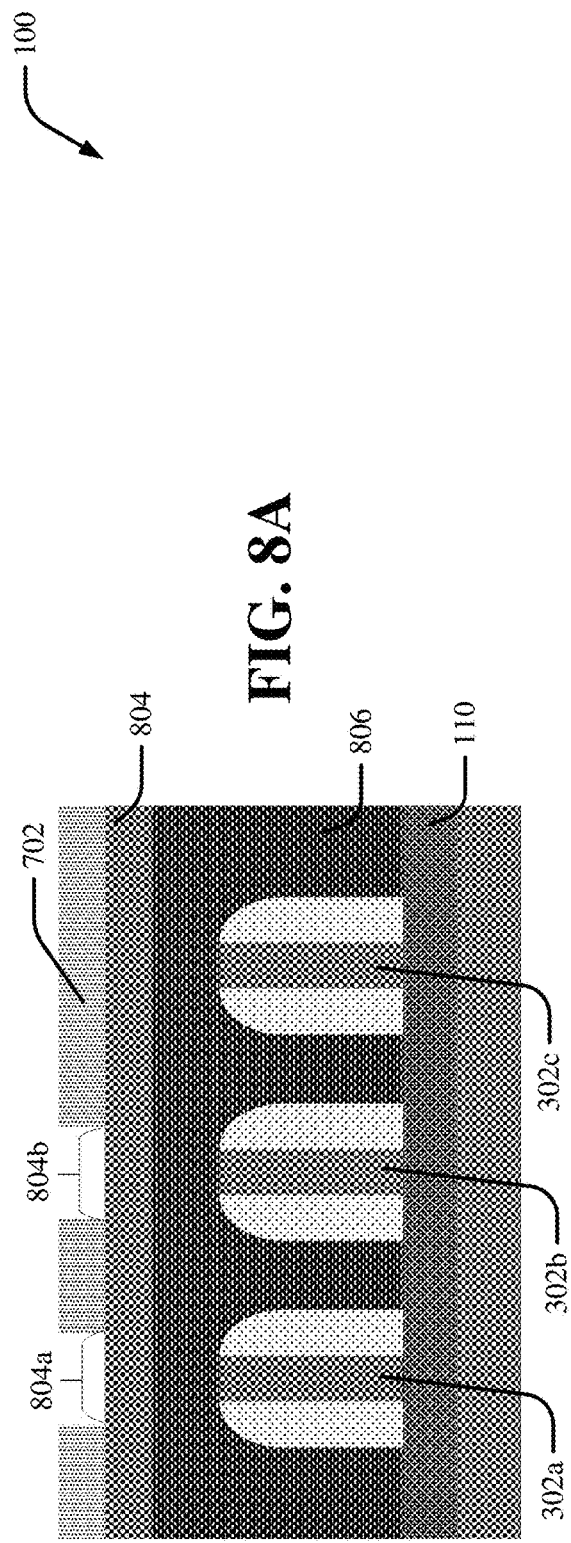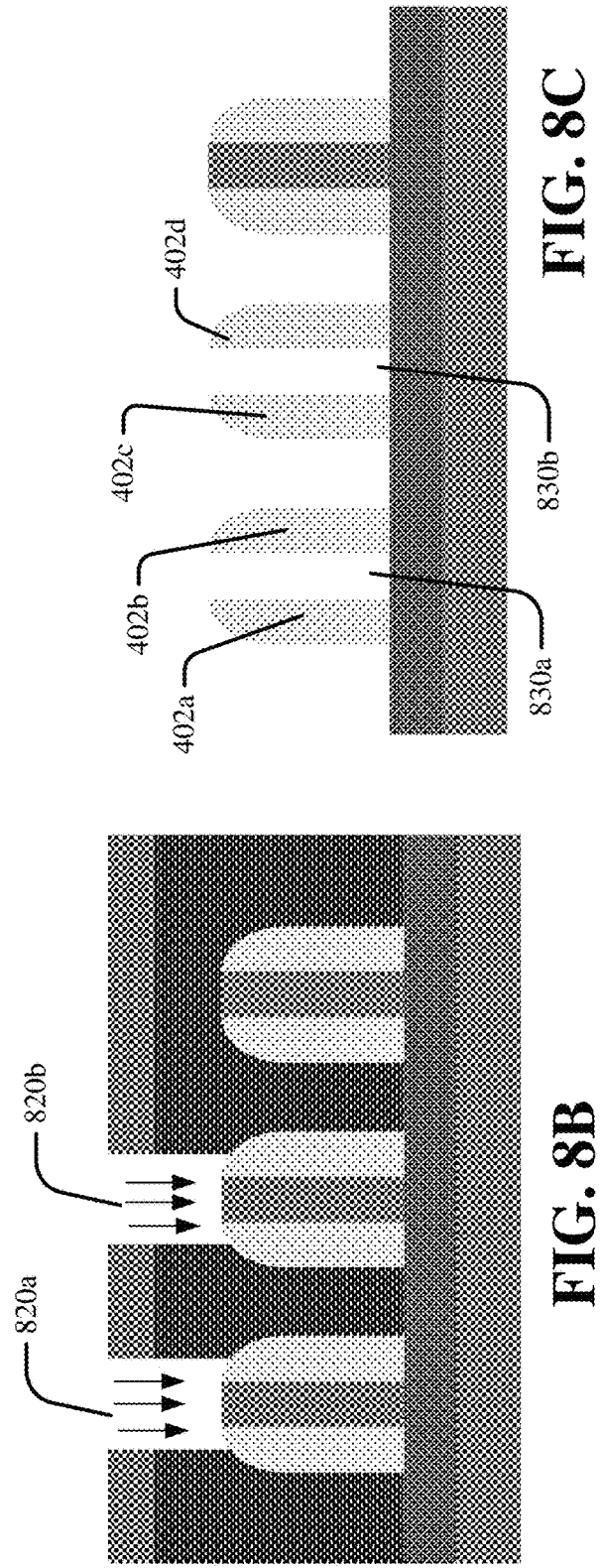

US 11,164,772 B2

1

SPACER-DEFINED PROCESS FOR LITHOGRAPHY-ETCH DOUBLE PATTERNING FOR INTERCONNECTS

BACKGROUND

The subject disclosure relates generally to fabrication of semiconductor devices and, more particularly, fabricating semiconductor devices using a spacer-defined process for lithography-etch double patterning for interconnects.

SUMMARY

The following presents a summary to provide a basic understanding of one or more embodiments of the invention. This summary is not intended to identify key or critical elements, delineate scope of the embodiments or scope of the claims. Its sole purpose is to present concepts in a simplified form as a prelude to the more detailed description that is presented later. In one or more embodiments is described herein, systems, methods, apparatus and/or computer program products that facilitate fabrication of semiconductor devices using the spacer-defined process for lithography-etch double patterning for interconnects.

According to an embodiment, a method can comprise performing a first lithography exposure and etch over a first layer of a semiconductor device, where the first lithography exposure and etch comprises forming one or more mandrels on a first region of a second layer by employing a first photoresist layer. The method can further comprise forming one or more spacers on a sidewall of the one or more mandrels and covering a second region of the second layer, where the second region is adjacent to the one or more mandrels. The method can further comprise forming a cut over a third region of the second layer and filling the third region with first material.

According to another embodiment, a method can comprise performing a first phase of fabricating a semiconductor device having plurality of layers, wherein the first phase comprises: performing a first lithography exposure and etch over a first region of a first layer of the semiconductor device and etching down a portion of the first layer to a second layer of the semiconductor device to form one or more mandrels. The method can further comprise performing a second phase of fabricating the semiconductor device, wherein the second phase comprises: forming one or more spacers on a sidewall of the one or more mandrels and forming a cut over a second region of the second layer and filling the second region with a first material. The method can further comprise performing a third phase of fabricating the semiconductor device, wherein the third phase comprises: performing a second lithography exposure and etch over a third region of the second layer of the semiconductor device.

According to another embodiment, a semiconductor device can comprise a substrate, wherein the substrate having a first pattern. The semiconductor device can further comprise a layer formed on the substrate, where the layer comprises an ultra-low-k dielectric film having second pattern.

BRIEF DESCRIPTION OF DRAWINGS

FIG. 4A illustrates an example, non-limiting top down view of a semiconductor device during one or more portions of the fabrication process wherein spacer material is deposited around the mandrels in accordance with one or more embodiments described herein.

FIG. 4B illustrates an example, non-limiting side cross-sectional view of a semiconductor device during one or more portions of the fabrication process wherein spacer material is deposited around the mandrels in accordance with one or more embodiments described herein.

FIG. 6A illustrates an example, non-limiting cross-sectional view of semiconductor device during one or more portions of the fabrication process in accordance with one or more embodiments described herein.

FIG. 6B illustrates an example, non-limiting cross-sectional view of semiconductor device during one or more portions of the fabrication process in accordance with one or more embodiments described herein.

FIG. 6C illustrates an example, non-limiting cross-sectional view of semiconductor device during one or more portions of the fabrication process in accordance with one or more embodiments described herein.

FIG. 6D illustrates an example, non-limiting cross-sectional view of semiconductor device during one or more portions of the fabrication process in accordance with one or more embodiments described herein.

FIG. 8A illustrates an example, non-limiting cross-sectional view of semiconductor device during one or more portions of the fabrication process in accordance with one or more embodiments described herein.

FIG. 8B illustrates an example, non-limiting cross-sectional view of semiconductor device during one or more portions of the fabrication process in accordance with one or more embodiments described herein.

FIG. 8C illustrates an example, non-limiting cross-sectional view of semiconductor device during one or more portions of the fabrication process in accordance with one or more embodiments described herein.

DETAILED DESCRIPTION

Figure 1:
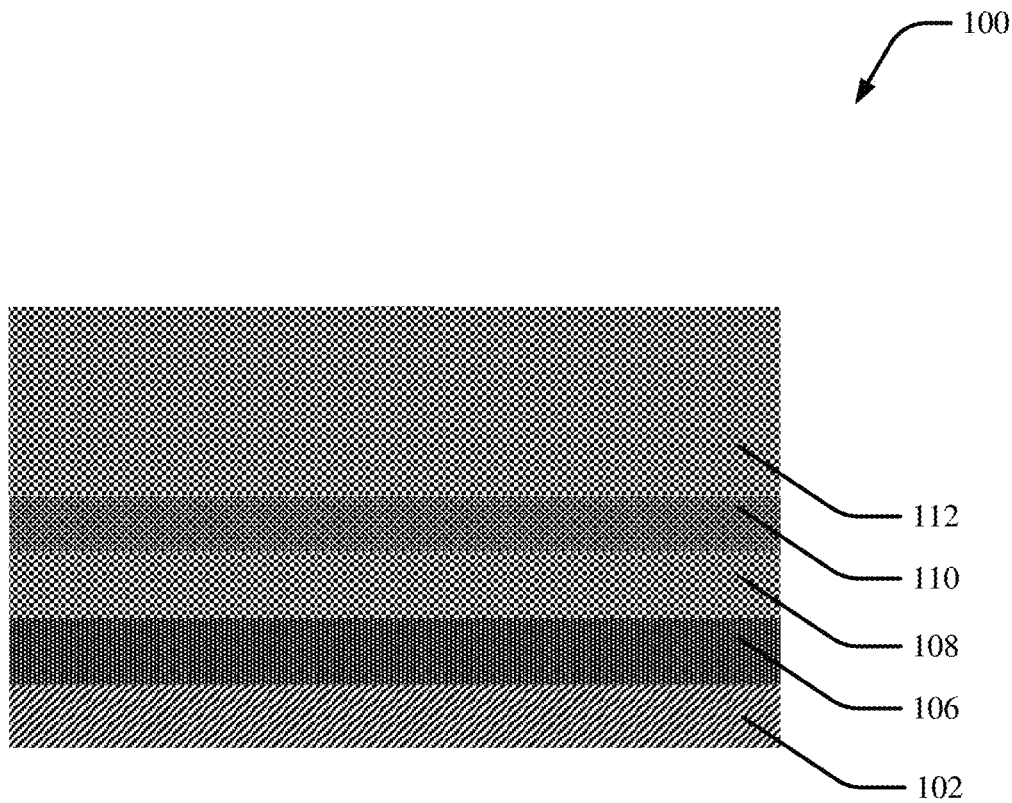
FIG. 1 illustrates an example, non-limiting cross-sectional view of a semiconductor device prior to fabrication in accordance with one or more embodiments is described herein.

The following detailed description is merely illustrative and is not intended to limit embodiments and/or applications or uses of embodiments. Furthermore, there is no intention to be bound by any expressed or implied information presented in the preceding Summary section, or in the Detailed Description section.

In one or more embodiments described herein, systems, and/or computer-implemented methods that facilitate fabrication of a semiconductor device using a spacer lithography-etch process. According to an embodiment, a method can comprise performing a first lithography-etching process at first region. The method can comprise depositing spacer at another region that is different from the first region. The method can comprise performing a cut and depositing spacer material over the cut region. The method can further comprise performing a first lithography-etching process at third region. The advantage of this employing the process described herein is that it provides design flexibility for developers of gate patterns on the semiconductor device by performing multiple lithography exposures on different regions and layers of the semiconductor device.

As used herein, unless otherwise specified, terms such as "on," "overlying," "atop," "on top," "positioned on," or "positioned atop" mean that a first element is present on a second element, wherein intervening elements may be present between the first element and the second element. As used herein, unless otherwise specified, the term directly used in connection with the terms "on," "overlying," "atop," "on top," "positioned on," or "positioned atop" "contacting," "directly contacting," or the term "direct contact," mean that a first element and a second element are connected without any intervening elements, such as, for example, "intermediary conducting," "insulating" or "semiconductor layers," present between the "first element" and the "second element." As used herein, terms such as "upper," "lower," "above," "below," "directly above," "directly below," "aligned with," "adjacent to," "right," "left," "vertical," "horizontal," "top," "bottom," and derivatives thereof shall relate to the disclosed structures as oriented in the drawing figures.

The terminology used herein is for describing embodiments only and is not intended to be limiting of the inventive concept. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. It is to be understood that when an element is referred to as being "connected" or "coupled" to another element, it may be directly connected or coupled to the other element or intervening elements may be present. In contrast, when an element is referred to as being "directly connected" or "directly coupled" to another element, there are no other intervening elements present.

Spatially relative terms, such as "beneath," "below," "around," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below.

It is to be understood that the various layers and/or regions shown in the accompanying drawings are not drawn to scale, and that one or more layers and/or regions of a type commonly used transistors, fins, and/or other semiconductor devices may not be explicitly shown in a given drawing. This does not imply that the layers and/or regions not explicitly shown are omitted from the actual transistor devices. In addition, certain elements may be left out of views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures may not be repeated for each of the drawings.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident; however, in various cases, that the one or more embodiments can be practiced without these specific details.

FIG. 1 illustrates an example, non-limiting cross-sectional view of a semiconductor device 100 prior to fabrication in accordance with one or more embodiments is described herein. Repetitive description and label of like elements employed in respective embodiments are omitted for sake of brevity. According to one or more embodiments, the semiconductor device 100 can comprise a substrate 102 having multiple layers. For example, the substrate 102 can be a target layer and a second layer 106 (e.g., a dielectric layer) can be formed, for example, above the substrate 102. The second layer 106 can be a dielectric layer formed with dielectric material. In some embodiments, any suitable dielectric material having an ultra-low-k (ULK) film, with k 2.0-4.0 and thickness 40-150 nm, can be used form the second layer 106. In some embodiments, a third layer 108 can be formed, for example, above the second layer 106. The third layer 108, can be a sacrificial layer having thickness of 5-40 nano-meters (nm). The sacrificial material may be amorphous silicon, silicon, epitaxy material or other suitable dielectric material. In some embodiments, the sacrificial material may be any suitable dielectric material such as silicon oxide, silicon nitride, silicon oxynitride, or silicon carbide. In some embodiments, the sacrificial material can also be organic dielectric material, or metal material, for example tungsten. In some embodiments, a fourth layer 110 can be formed, for example, above the third layer 108. The fourth layer 110 (e.g., a memorization layer) can comprise titanium nitrite material with thickness of 10-30 nm. The fourth layer 110 can, for example, comprise silicon dioxide, silicon oxynitride, or silicon nitride. A fifth layer 112 can be formed, for example, above the fourth layer 110. In some embodiments, the fifth layer 112 can comprise a silicon nitride (SiN) film and can be employed to form one or more mandrels (e.g., a guiding structure). The mandrel, for example, can be used to form spacers to protect the pattern during subsequent etch processes. In some embodiments, the thickness of the fifth layer 112 can be 20-100 nm.

FIGS. 2-10 illustrate a fabrication process (e.g., spacer lithography-etch process) for forming trench patterns on the semiconductor device 100 in accordance with one or more embodiments. The illustration respectively present intermediate semiconductor structures formed in association with an example fabrication process for forming the semiconductor device using a spacer-defined process for lithography-etch double patterning for interconnects in accordance with embodiments described herein. In this regard, the respective FIGS. 2-10 pictorially demonstrate a sequential flow of respective fabrication steps of the example fabrication process. Repetitive description of like elements shown in respective embodiments is omitted for sake of brevity.

Figure 2A:
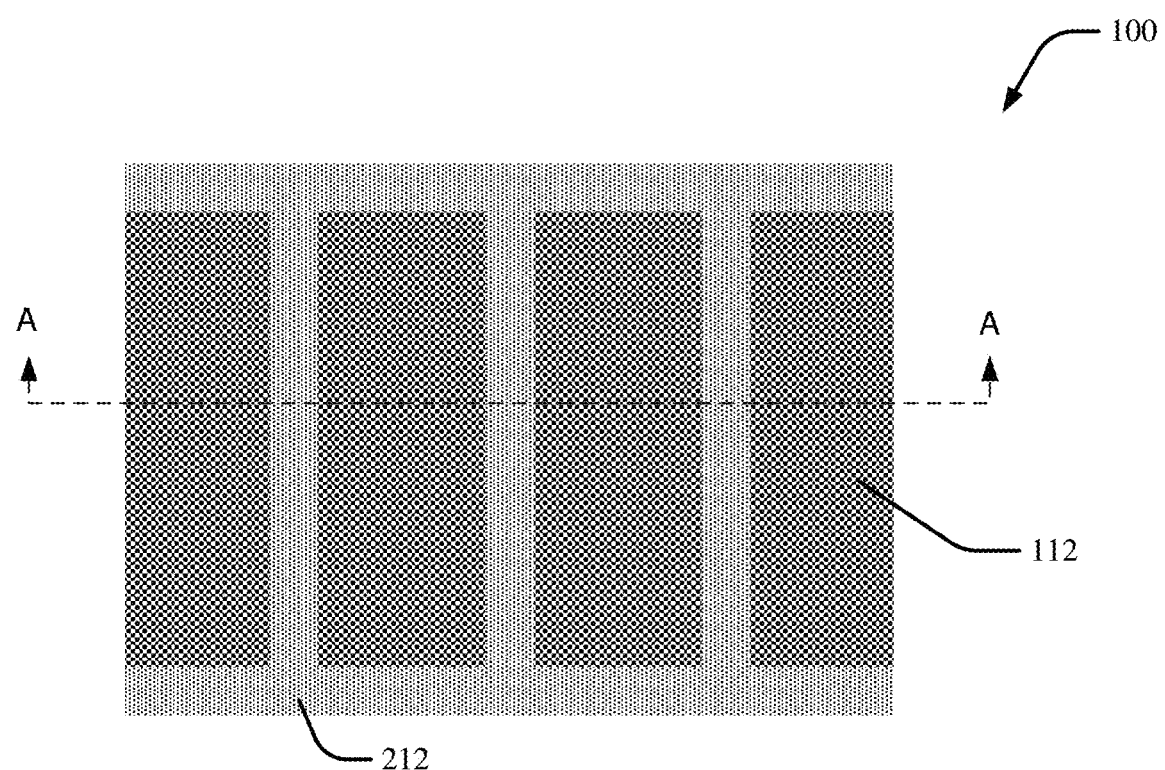
FIG. 2A illustrates an example, non-limiting top down view of a semiconductor device during one or more portions of the fabrication process in accordance with one or more embodiments described herein.

FIG. 2A illustrates an example, non-limiting top down view of a semiconductor device 100 during one or more portions of the fabrication process in accordance with one or more embodiments described herein. Repetitive description and label of like elements employed in respective embodiments are omitted for sake of brevity. According to one or more embodiments, a first photoresist layer 212 (e.g., also known as "resist") can be placed/formed above the fifth layer 112 of the semiconductor device. A photoresist is a light-sensitive material used to create patterns with light, then block the etch process to the layer underneath (e.g., the fifth layer). The resist is exposed with extreme ultraviolet (EUV) light where the underlying material is to be removed. Exposure to the EUV light changes the chemical structure of the resist so that it becomes more soluble. The exposed resist is then washed away by a solution, leaving windows of the bare underlying material. The mask, therefore, contains an exact copy of the pattern which is to remain on the wafer (e.g., fifth layer 112), as a stencil for subsequent processing. The resist can be very thin film (as low as 20 nanometer) and constructed using any suitable patternable hard mask material for example, but not limited to, a metal oxide or organic polymer. In some embodiments, the first photoresist layer 212, for example, can comprise a predefined pattern that defines a region to be protected/blocked from an etch process. The lithography process includes lithography exposure (e.g., application of extreme ultraviolet light) that can be employed to create patterns that are used to subsequently etch one or more portions of the semiconductor device 100 layer. In some examples of the first lithography process for semiconductor technology, the first photoresist (also called resist) is used to block an etch process over the area covered by the photoresist layer. Using the photoresist layer 212, various patterns can be formed by implementing the etch process over portions not covered by the photoresist pattern. As an example, the developers can create desired patterns on the first photoresist layer 212. The patterns can be used for blocking a portion of the layer (e.g., fifth layer) and etching down a portion of the layer (e.g., a first region) to the next layer (e.g., fourth layer).

Figure 2B:
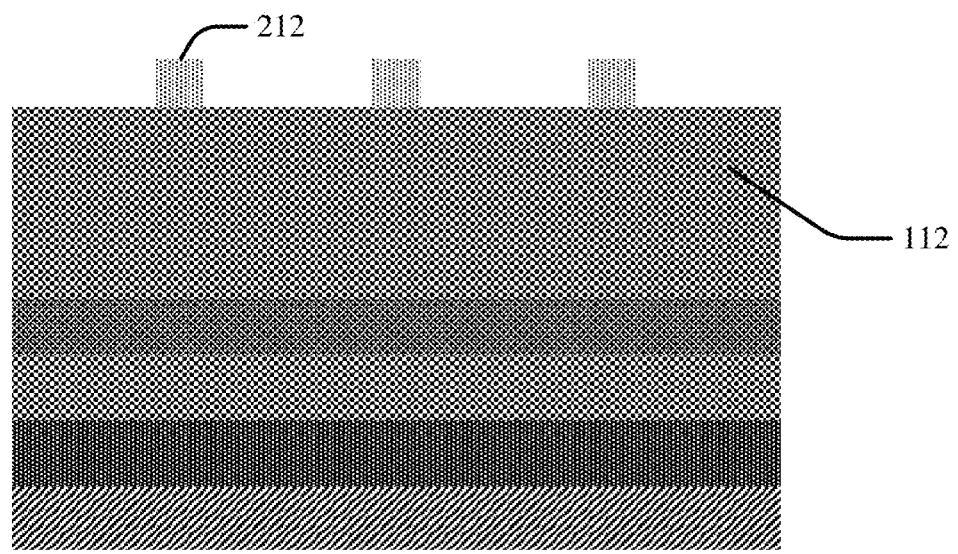
FIG. 2B illustrates an example, non-limiting side cross-sectional view of a semiconductor device having the photoresist layer placed over the fifth layer during one or more portions of the fabrication process in accordance with one or more embodiments described herein.

FIG. 2B illustrates an example, non-limiting side cross-sectional view of a semiconductor device having the photoresist layer placed over the fifth layer 112 during one or more portions of the fabrication process in accordance with one or more embodiments described herein. Repetitive description and label of like elements employed in respective embodiments are omitted for sake of brevity.

Figure 3A:
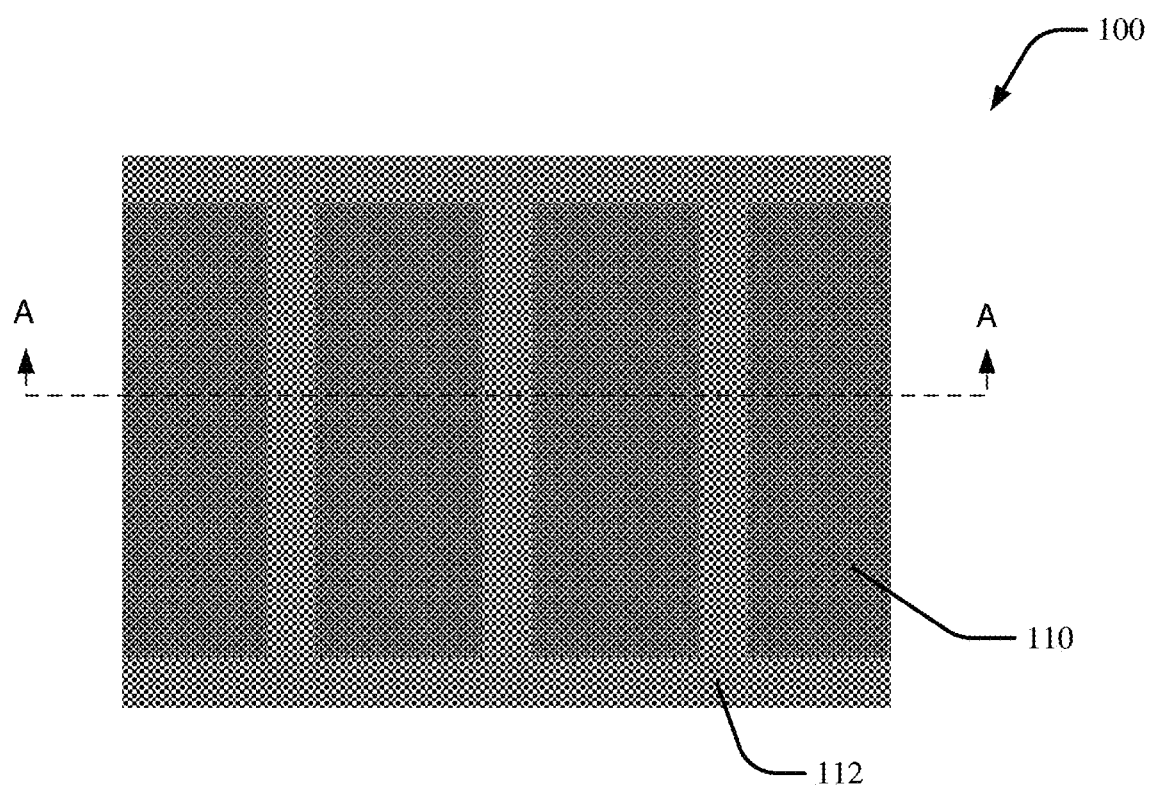
FIG. 3A illustrates an example, non-limiting top down view of a semiconductor device during one or more portions of the fabrication process wherein the exposed portion of the fifth layer is etched away in accordance with one or more embodiments described herein.

FIG. 3A illustrates an example, non-limiting top down view of a semiconductor device 100 during one or more portions of the fabrication process wherein the exposed portion of the fifth layer 112 is etched down (e.g., removed) in accordance with one or more embodiments described herein. Repetitive description and label of like elements employed in respective embodiments are omitted for sake of brevity. According to one or more embodiments, the portion of the fifth layer 112 that was covered by the first photoresist layer 212, forms one or more mandrels 312*a-c* upon application of etch process. In some embodiments, performing an etch until the exposed portion of the fifth layer 112 is etched down to the fourth layer 110. The remaining portion of the fifth layer 112 forms mandrels 302*a-c* based on the pattern created on the first photoresist layer 212.

Figure 3B:
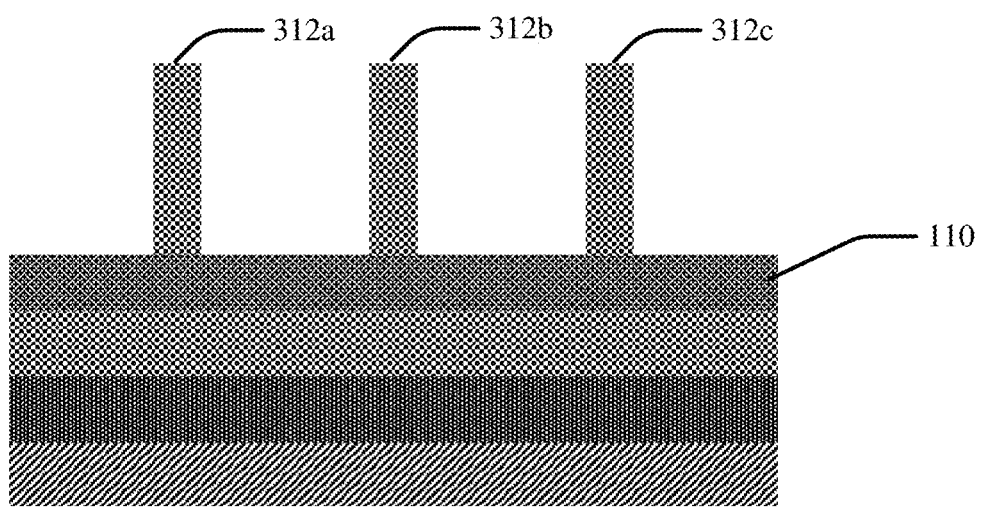
FIG. 3B illustrates an example, non-limiting side cross-sectional view of a semiconductor device after the exposed portion of the fifth layer is removed in accordance with one or more embodiments described herein.

FIG. 3B illustrates an example, non-limiting side cross-sectional view of a semiconductor device after the exposed portion of the fifth layer 112 is removed in accordance with one or more embodiments described herein. Repetitive description and label of like elements employed in respective embodiments are omitted for sake of brevity. In some embodiments, an etch process can be performed to etch down the exposed portions of fifth layer 112 to the fourth layer 110. In some embodiments, etching the exposed portion forms, for example, one or more mandrels 302*a-c* overlying the fourth layer 110 by the portion covered by photoresist layer during the etching process.

FIG. 4A illustrates an example, non-limiting top down view of a semiconductor device 100 during one or more portions of the fabrication process wherein spacer material is deposited around the mandrels 312*a-c* in accordance with one or more embodiments described herein. Repetitive description and label of like elements employed in respective embodiments are omitted for sake of brevity. As illustrated, a spacer material 402 is deposited and etched to form the spacer around mandrels 312*a-c* and cover the adjacent portions of the fourth layer 110 that is exposed. In some embodiments, the spacer material 402 can comprise silicon nitride. Any suitable material can be used to form spacer, for example, but not limited to, silicon boron carbon nitride (SiBCN), silicon dioxide (SiO2), titanium dioxide (TiO2), silicon nitride (SiN), titanium oxynitride (TiON), or silicon oxynitride (SiON).

FIG. 4B illustrates an example, non-limiting side cross-sectional view of a semiconductor device 100 during one or more portions of the fabrication process wherein spacer material is deposited and etched to form the spacer around the mandrels 312*a-c* in accordance with one or more embodiments described herein. Repetitive description and label of like elements employed in respective embodiments are omitted for sake of brevity.

As illustrated, in accordance to some embodiments, the deposition and etching of the spacer material 412 forms one or more spacers 402*a-b* around mandrel 312*a*, spacers 402c-d around mandrel 312b, and spacers 402e-f around mandrel 312c. Also, as illustrated, a first set of trenches 410a and 412a are formed between spacers 402b-c and 402d-e, respectively. For example, a trench is defined at portions of the fourth layer that remains exposed between the spacers.

Figure 5:
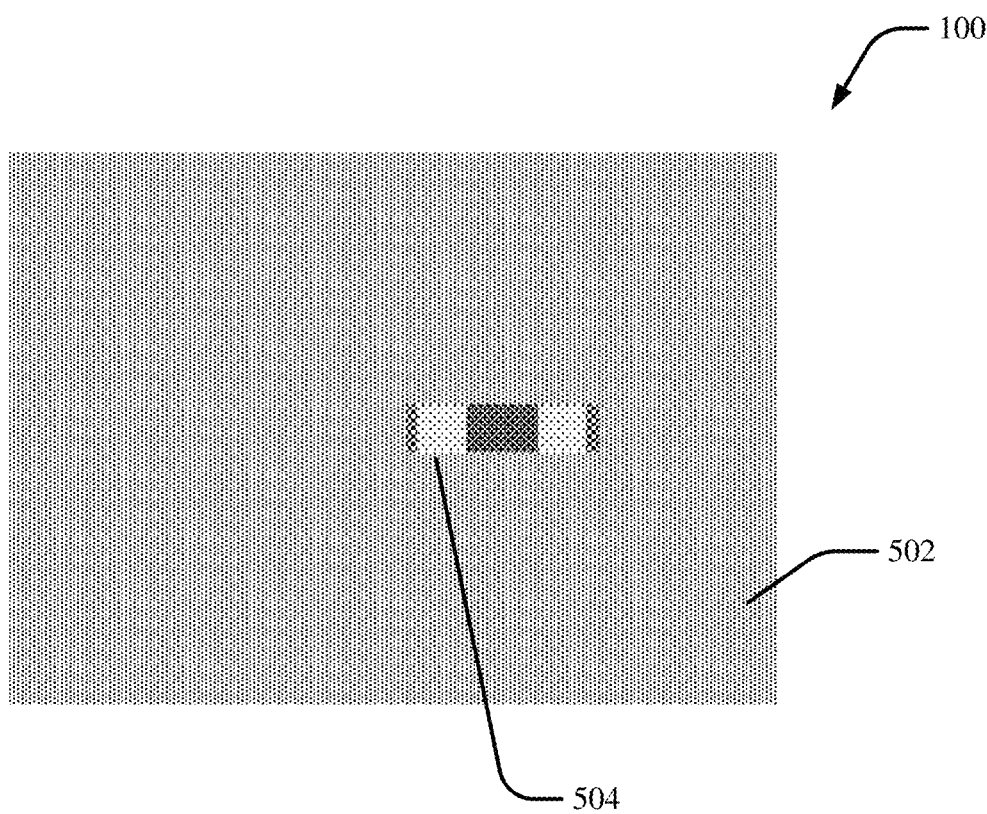
FIG. 5 illustrates an example, non-limiting top down view of a semiconductor device during one or more portions of the fabrication process in accordance with one or more embodiments described herein.

FIG. 5 illustrates an example, non-limiting top down view of a semiconductor device 100 during one or more portions of the fabrication process in accordance with one or more embodiments described herein. Repetitive description and label of like elements employed in respective embodiments are omitted for sake of brevity. According to an embodiment, a second photoresist layer 502 can be formed. For example, the second photoresist layer 502 can be patterned with a cutout region 504 (e.g., second pattern). In some embodiments, additional material similar in composition to the spacer material can be deposited at region on the fourth layer 110 defined by the cutout region 504. As illustrated in FIGS. 6A-D, depositing the additional material 402 at the cutout causes covered portion from being exposed during any future etch process.

FIGS. 6A-D illustrates an example, non-limiting cross-sectional view of semiconductor device 100 during one or more portions of the fabrication process wherein a cut process is employed to block defined portion of layer in accordance with one or more embodiments described herein. Repetitive description and label of like elements employed in respective embodiments are omitted for sake of brevity.

FIG. 6A illustrates an example, non-limiting cross-sectional view of semiconductor device 100 during one or more portions of the fabrication process in accordance with one or more embodiments described herein. Repetitive description and label of like elements employed in respective embodiments are omitted for sake of brevity.

According to one or more embodiments, a carbon-containing organic-planarizing layer (OPL) 606 is applied to fully cover the mandrels 302a-c. The OPL layer can be used to protect the desired portion of the semiconductor during cutout process. The depth of the OPL is not critical as long as the top portion of the mandrels 302a-c are covered. As depicted, in some embodiments, a spacer-like layer 604 is formed on top of OPL 606 to form layer between the OPL and the second photoresist layer.

FIG. 6B illustrates an example, non-limiting cross-sectional view of semiconductor device 100 during one or more portions of the fabrication process in accordance with one or more embodiments described herein. Repetitive description and label of like elements employed in respective embodiments are omitted for sake of brevity. According to one or more embodiments, as depicted, the spacer layer 604, OPL 606 and the second photoresist layer 502 are etched out to the fourth layer 110 and creating a third trench 610.

FIG. 6C illustrates an example, non-limiting cross-sectional view of semiconductor device 100 during one or more portions of the fabrication process in accordance with one or more embodiments described herein. Repetitive description and label of like elements employed in respective embodiments are omitted for sake of brevity. According to one or more embodiments, spacer-like material 612 can be deposited extending, for example, up to the spacer layer 604.

FIG. 6D illustrates an example, non-limiting cross-sectional view of semiconductor device 100 during one or more portions of the fabrication process in accordance with one or more embodiments described herein. Repetitive description and label of like elements employed in respective embodiments are omitted for sake of brevity. According to one or more embodiments, the spacer material 602 deposited in the third trench 610 is etched down and removes top spacer layer 604 as depicted. The depth of the spacer material is not critical as long as the spacer material cover the third trench 610.

Figure 7:
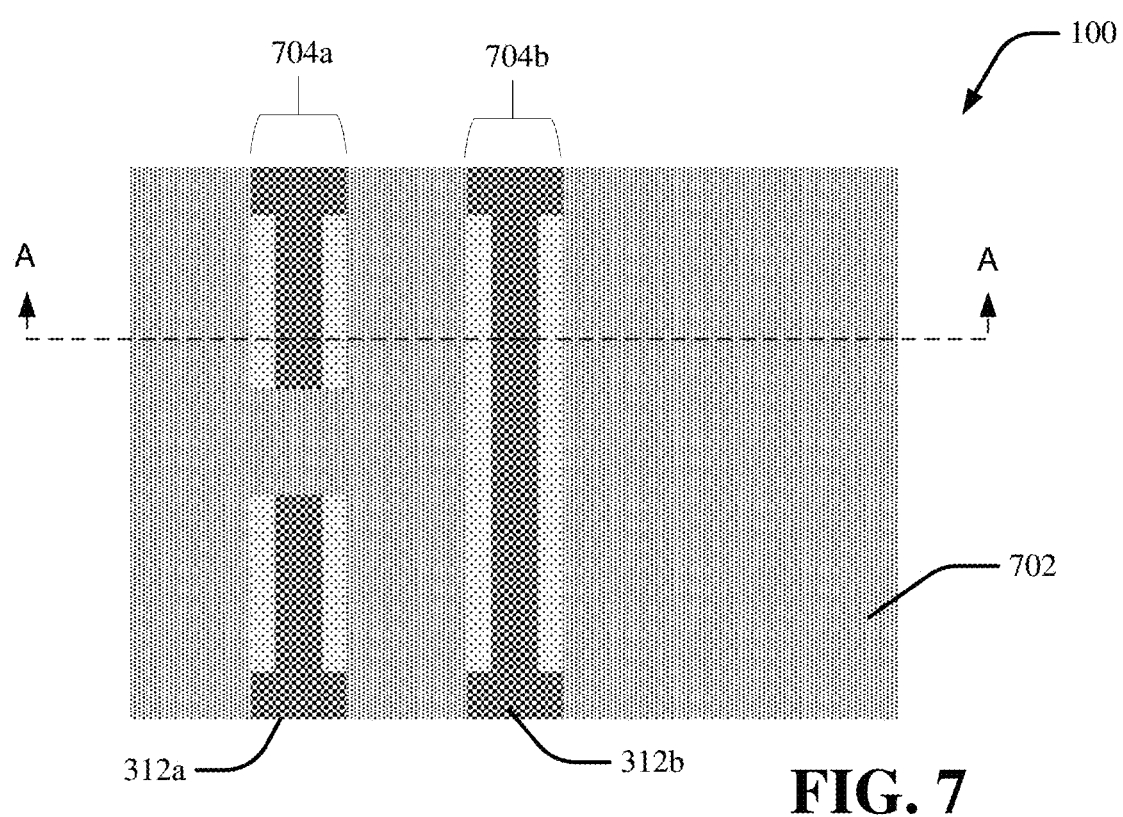
FIG. 7 illustrates an example, non-limiting top down view of a semiconductor device during one or more portions of the fabrication process in accordance with one or more embodiments described herein.

FIG. 7 illustrates an example, non-limiting top down view of a semiconductor device 100 during one or more portions of the fabrication process in accordance with one or more embodiments described herein. Repetitive description and label of like elements employed in respective embodiments are omitted for sake of brevity. According to an embodiment, a third photoresist layer 702 can be formed. For example, the third photoresist layer 702 can be patterned with cutouts 704a-b (e.g., third pattern) to expose portion of the mandrel 312a and all of the mandrel 312b.

FIGS. 8A-C illustrates an example, non-limiting cross-sectional view of semiconductor device 100 during one or more portions of the fabrication process wherein portion of fifth layer that is exposed is removed in accordance with one or more embodiments described herein. Repetitive description and label of like elements employed in respective embodiments are omitted for sake of brevity.

FIG. 8A illustrates an example, non-limiting cross-sectional view of semiconductor device 100 during one or more portions of the fabrication process in accordance with one or more embodiments described herein. Repetitive description and label of like elements employed in respective embodiments are omitted for sake of brevity. According to one or more embodiments, a second OPL 806 is formed over the fourth layer 110 extending upward to fully cover the mandrels 302a-c. The second OPL 806 can be used to protect the desired portion of the semiconductor during additional fabrication process. As depicted, in some embodiments, a mandrel material 804 is formed on top of the second OPL 806 to form layer between the second OPL 806 and the third photoresist layer 702 having cutout regions 804a-b.

FIG. 8B illustrates an example, non-limiting cross-sectional view of semiconductor device 100 during one or more portions of the fabrication process in accordance with one or more embodiments described herein. Repetitive description and label of like elements employed in respective embodiments are omitted for sake of brevity. According to an embodiment, a lithography and etch process (e.g., third lithography process) is applied at cutouts 704a and 704b. In some embodiments, the spacer material 804 and the second OPL 806 material exposed by the cutouts 704a and 704b are etched down to expose the mandrel 302a and 302b, respectively. The third photoresist layer 702 is etched away while etching the second OPL 806.

FIG. 8C illustrates an example, non-limiting cross-sectional view of semiconductor device 100 during one or more portions of the fabrication process in accordance with one or more embodiments described herein. Repetitive description and label of like elements employed in respective embodiments are omitted for sake of brevity. According to an embodiment, as depicted the mandrels 302a-b and top mandrel layer 804 are removed using an etch process. Upon removal of the mandrels 302a-b and top mandrel layer 804 and OPL 806, trenches 830a-b are formed exposing portion of the fourth layer 110.

Figure 9A:
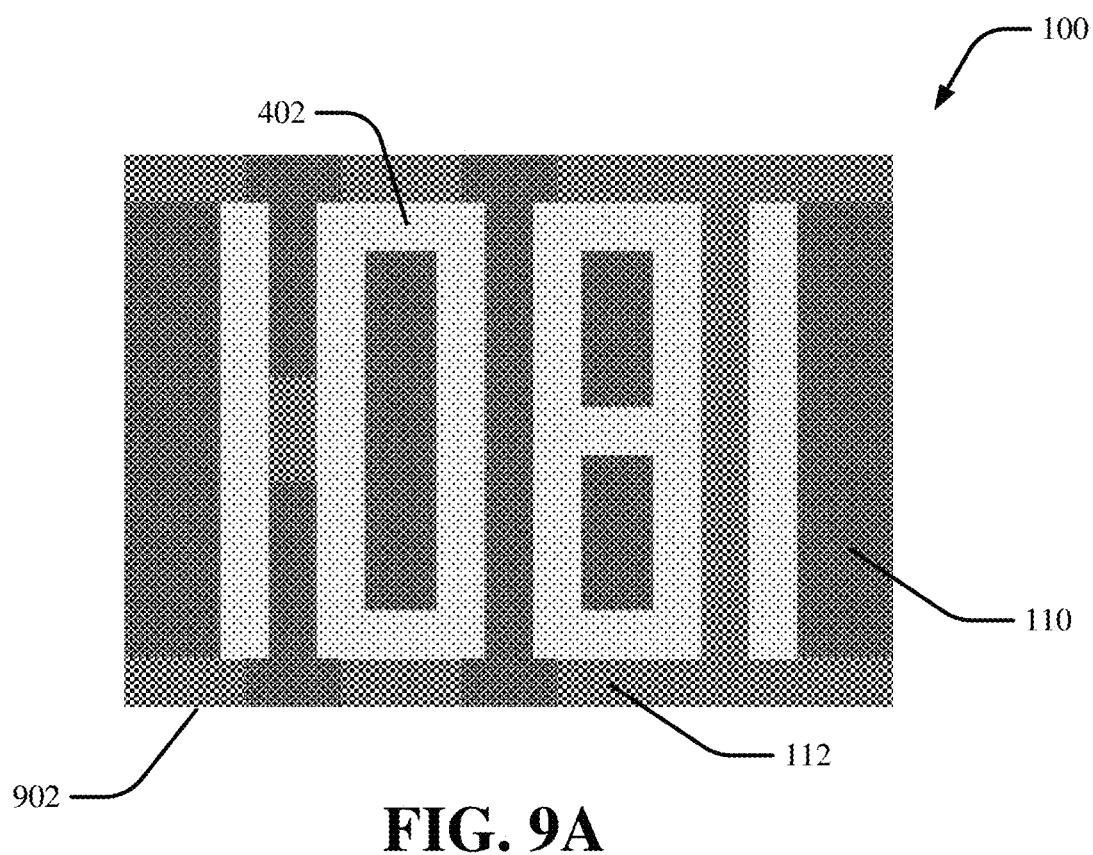
FIG. 9A illustrates an example, non-limiting top down view of a semiconductor device during one or more portions of the fabrication process in accordance with one or more embodiments described herein.

FIG. 9A illustrates an example, non-limiting top down view of a semiconductor device 100 during one or more portions of the fabrication process in accordance with one or more embodiments described herein. Repetitive description and label of like elements employed in respective embodiments are omitted for sake of brevity. According to an embodiment, as depicted, the semiconductor device 100 can comprise, for example, a final pattern wherein the fourth layer 110 is covered by spacer material 402 and portion of the fifth layer 112 blocked from etch during the various portions of litho-etch-spacer-cut-litho-etch process described above.

Figure 9B:
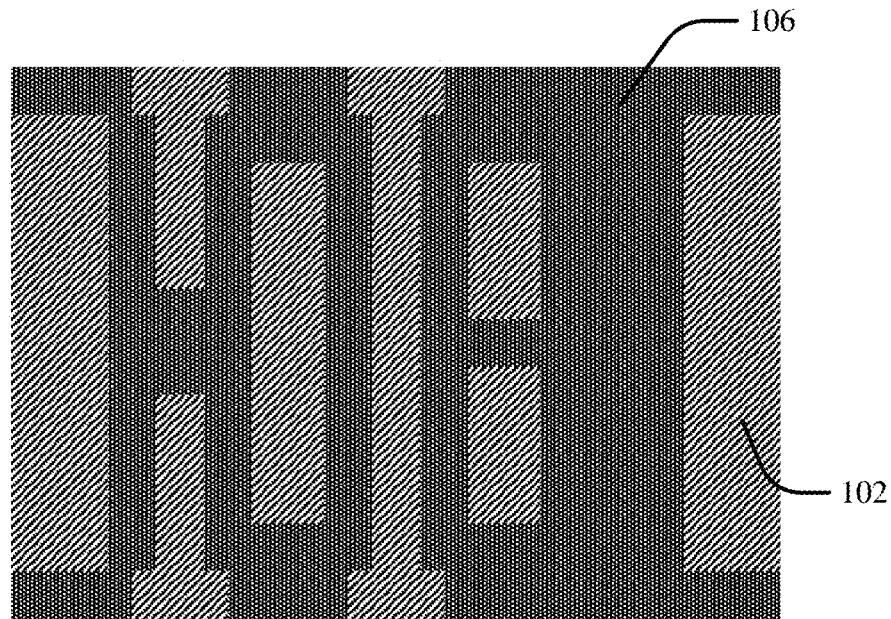
FIG. 9B illustrates an example, non-limiting top down view of a semiconductor device during one or more portions of the fabrication process in accordance with one or more embodiments described herein.

FIG. 9B illustrates an example, non-limiting top down view of a semiconductor device 100 during one or more portions of the fabrication process in accordance with one or more embodiments described herein. Repetitive description and label of like elements employed in respective embodiments are omitted for sake of brevity. According to an embodiment, the substrate 102 and second layer 106 are exposed and can be the final layers of the device 100. In some embodiments, exposed and/or remaining portion of fourth layer 110 is etched down to expose substrate 102, and remaining portions of fifth layer 112 and spacer material 412 are etched down to expose second layer 106. In some embodiments, the semiconductor device 100 comprises substrate 102 having a portion of the second layer 106. The remaining portion of the substrate 102 having a first pattern and the remain portion of the second layer 106 having a second pattern, wherein in the first pattern and the second pattern are orthogonal to each other. In some embodiments, the first layer comprises copper metal and the second layer comprises ultra-low-k dielectric film having a thickness of less than 0.5 pitch 40-150 nm.

Figure 10:
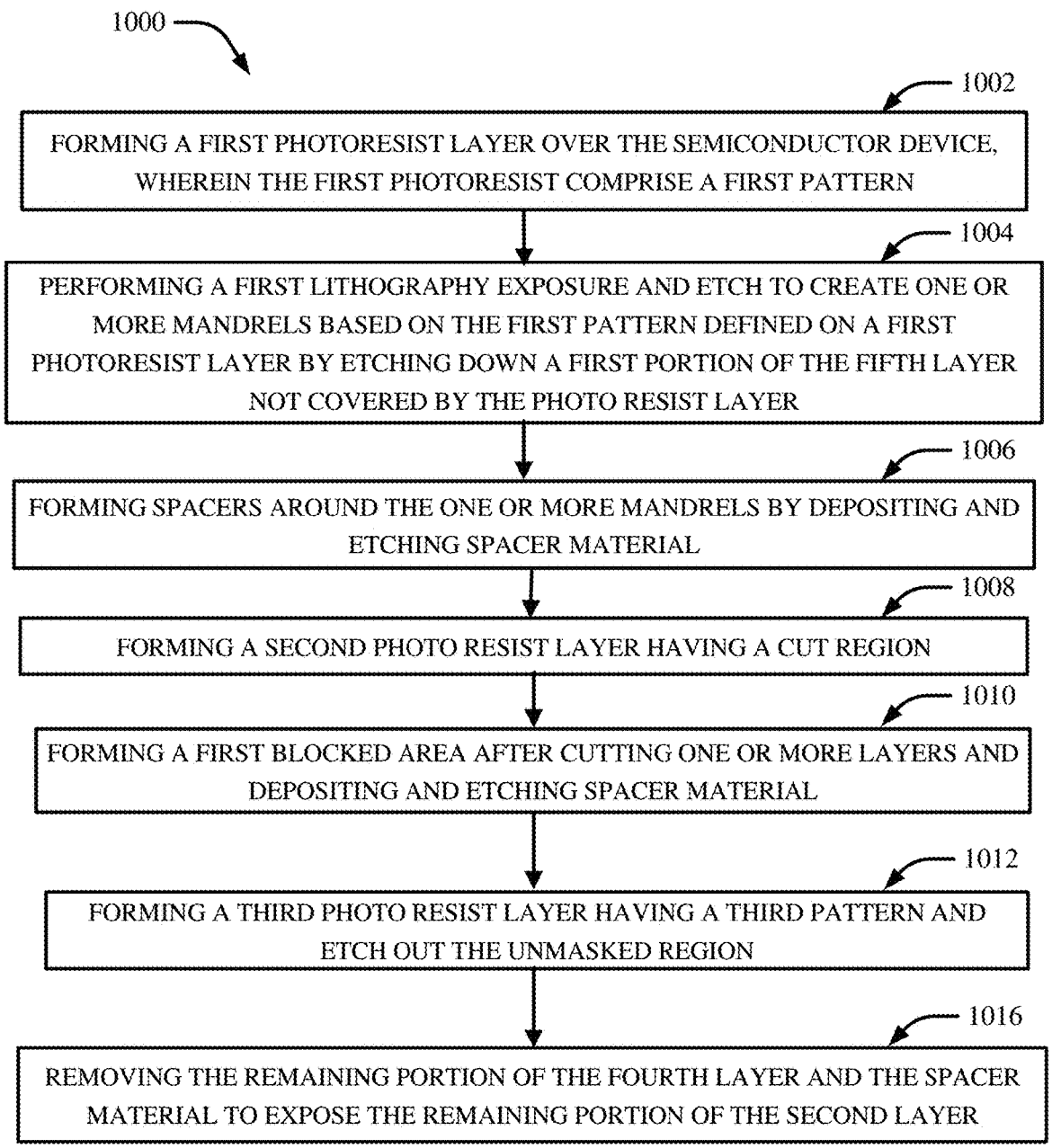
FIG. 10 illustrates a flow diagram of an example, non-limiting method of fabricating semiconductor device in accordance with one or more embodiments described herein.

FIG. 10 illustrates a flow diagram of an example, non-limiting method 1000 of fabricating the semiconductor device 100 in accordance with one or more embodiments described herein. Repetitive description and label of like elements employed in respective embodiments are omitted for sake of brevity. According to one or more embodiments, at block 1002, forming a first photoresist layer over the semiconductor device 100, wherein the first photoresist comprises a first pattern. At block 1004, performing a first lithography exposure and etch to create one or more mandrels based on the first pattern defined on a first photoresist layer by etching down a first portion of the fifth layer 112 not covered by the first photoresist layer 212. At block 1006, forming the spacers 402a-f around the one or more mandrels 302a-b by depositing and etching spacer material. At block 1008, forming a second photoresist layer 502 having a cut region. At block 1010, forming a first blocked area after cutting one or more layers and depositing spacer material. At block 1012, forming a third photoresist layer 702 having a third pattern that exposes a third region (e.g., 704a-b FIG. 7) and etch out the unmasked region. At block 1014, removing the remaining portion of the fourth layer 110 and the spacer material to expose the remaining portion of the second layer 106.

Figure 11:
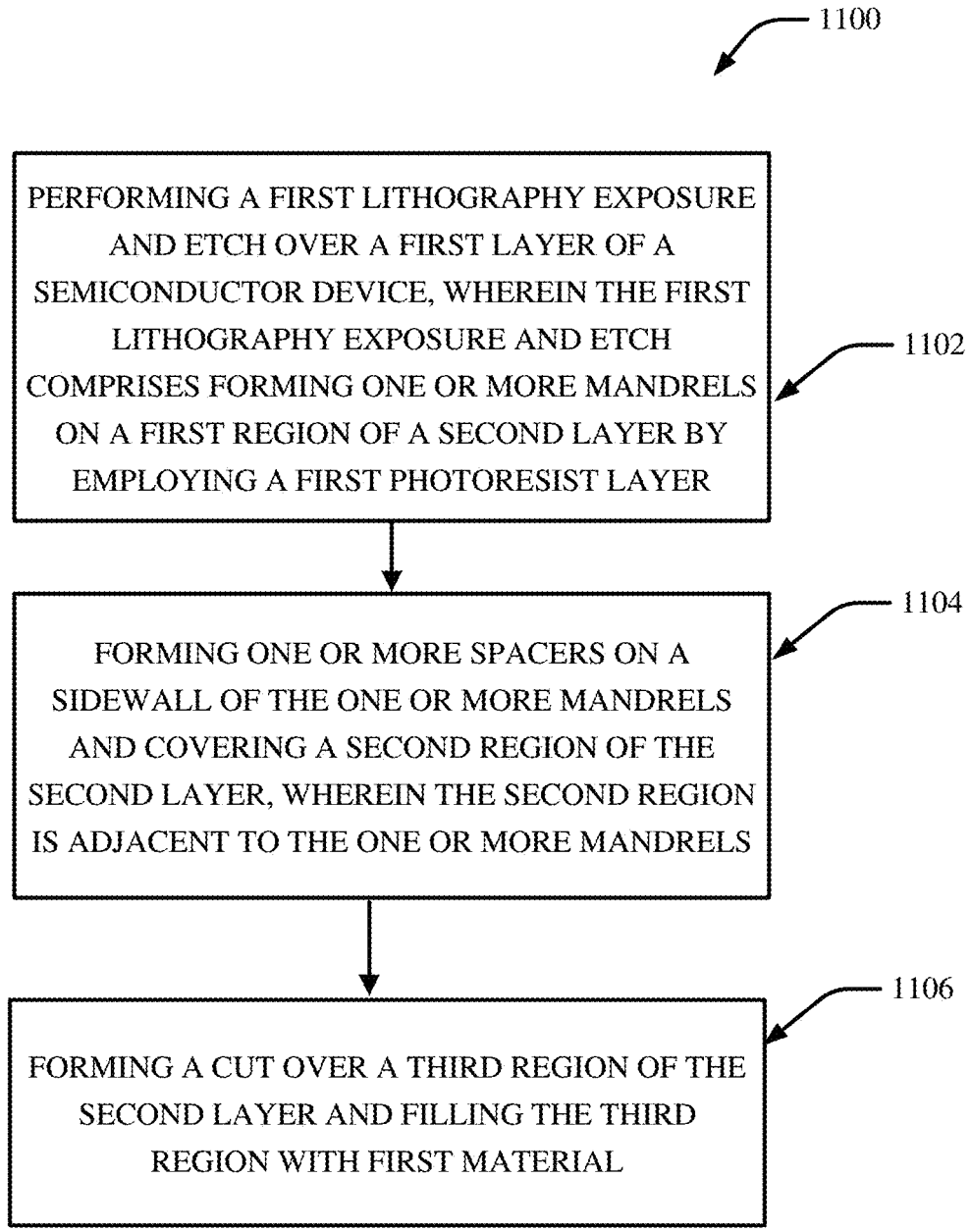
FIG. 11 illustrates a flow diagram of an example, non-limiting computer-implemented method that facilitates fabricating the semiconductor device in accordance with one or more embodiments described herein.

FIG. 11 illustrates a flow diagram of an example, non-limiting computer-implemented method 1000 that facilitates fabricating the semiconductor device 100 in accordance with one or more embodiments described herein. In some examples, flow diagram 1100 can be implemented by operating environment 1300. It can be appreciated that the operations of flow diagram 1100 can be implemented in a different order than is depicted. It can also be appreciated that the operations of flow diagram 1100 can be implemented in a different order than is depicted.

In non-limiting example embodiments, a computing device (or system) (e.g., computer 1312) is provided comprising one or more processors and one or more memories that stores executable instructions that, when executed by the one or more processors, can facilitate performance of the operations as described herein, including the non-limiting methods as illustrated in the flow diagrams of FIG. 11. As a non-limiting example, the one or more processors can facilitate performance of the methods by directing or controlling one or more equipment operable to perform semiconductor fabrication.

Operation 1102 depicts performing (e.g., by computer 1312) a first lithography exposure over a first layer of a semiconductor device, wherein the first lithography exposure comprises forming one or more mandrels on a first region of a second layer by employing a first photoresist layer. Operation 1104 depicts forming (e.g., by computer 1312) one or more spacers on a sidewall of the one or more mandrels and covering a second region of the second layer, wherein the second region is adjacent to the one or more mandrels. Operation 1106 depicts forming (e.g., by computer 1312) a cut over a third region of the second layer and filling the third region with first material.

Figure 12:
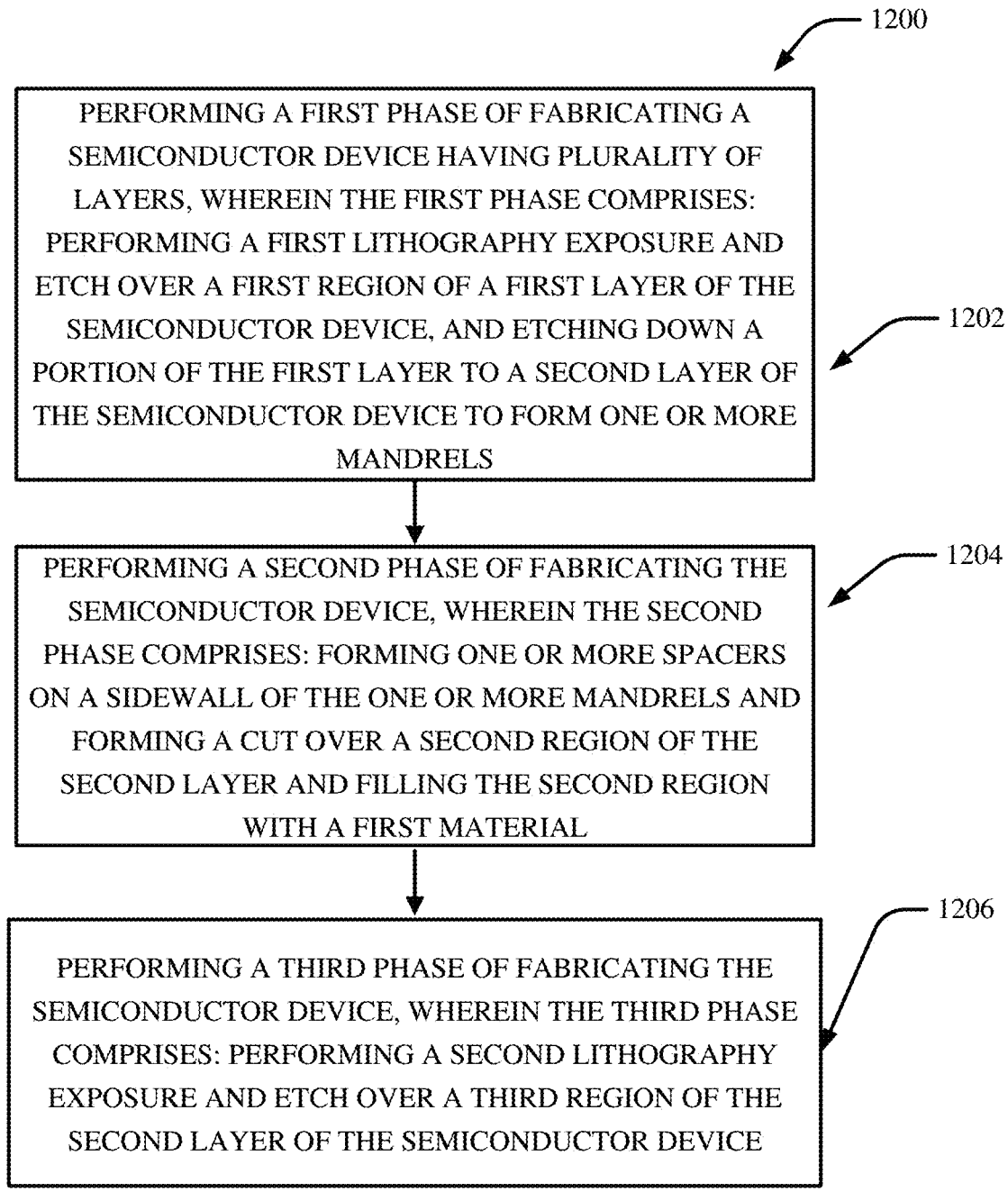
FIG. 12 illustrates a flow diagram of an example, non-limiting computer-implemented method that facilitates fabricating the semiconductor device in accordance with one or more embodiments described herein.

FIG. 12 illustrates a flow diagram of an example, non-limiting computer-implemented method that facilitates fabricating the semiconductor device 100 in accordance with one or more embodiments described herein. In some examples, flow diagram 1200 can be implemented by operating environment 1300. It can be appreciated that the operations of flow diagram 1200 can be implemented in a different order than is depicted. It can also be appreciated that the operations of flow diagram 1200 can be implemented in a different order than is depicted.

In non-limiting example embodiments, a computing device (or system) (e.g., computer 1312) is provided comprising one or more processors and one or more memories that stores executable instructions that, when executed by the one or more processors, can facilitate performance of the operations as described herein, including the non-limiting methods as illustrated in the flow diagrams of FIG. 12. As a non-limiting example, the one or more processors can facilitate performance of the methods by directing or controlling one or more equipment operable to perform semiconductor fabrication.

Operation 1202 depicts performing (e.g., by computer 1312) a first phase of fabricating a semiconductor device having plurality of layers, wherein the first phase comprises: performing a first lithography exposure over a first region of a first layer of the semiconductor device and etching down a portion of the first layer to a second layer of the semiconductor device to form one or more mandrels. Operation 1204 depicts (e.g., by computer 1312) performing a second phase of fabricating the semiconductor device, wherein the second phase comprises: forming one or more spacers on a sidewall of the one or more mandrels and forming a cut over a second region of the second layer and filling the second region with a first material. Operation 1206 depicts performing (e.g., by computer 1312) a third phase of fabricating the semiconductor device, wherein the third phase comprises: performing a second lithography exposure over a third region of the second layer of the semiconductor device.

Figure 13:
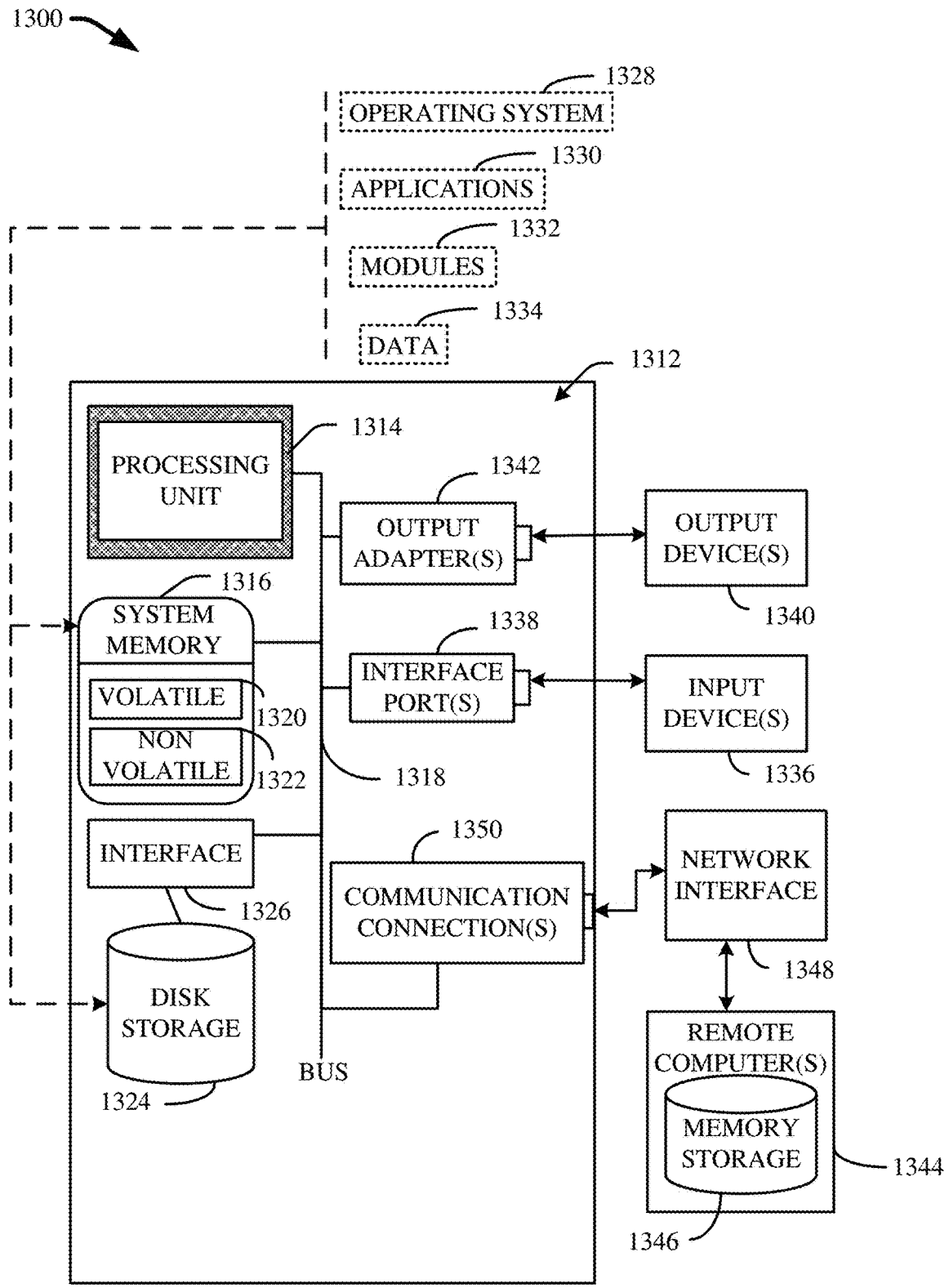
FIG. 13 illustrates a block diagram of an example, non-limiting operating environment in which one or more embodiments is described herein can be facilitated.

To provide context for the various aspects of the disclosed subject matter, FIG. 13 as well as the following discussion are intended to provide a general description of a suitable environment in which the various aspects of the disclosed subject matter can be implemented. FIG. 13 illustrates a block diagram of an example, non-limiting operating environment in which one or more embodiments described herein can be facilitated. Repetitive description of like elements employed in other embodiments described herein is omitted for sake of brevity.

A suitable operating environment 1300 for implementing various aspects of this disclosure can also include a computer 1312. The computer 1312 can also include a processing unit 1314, a system memory 1316, and a system bus

1318. The system bus 1318 couples system components including, but not limited to, the system memory 1316 to the processing unit 1314. The processing unit 1314 can be any of various available processors. Dual microprocessors and other multiprocessor architectures also can be employed as the processing unit 1314. The system bus 1318 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI). The system memory 1316 can also include volatile memory 1320 and nonvolatile memory 1322. The basic input/output system (BIOS), containing the basic routines to transfer information between elements within the computer 1312, such as during start-up, is stored in nonvolatile memory 1322. By way of illustration, and not limitation, nonvolatile memory 1322 can include read only memory (ROM), programmable ROM (PROM), electrically programmable ROM (EPROM), electrically erasable programmable ROM (EEPROM), flash memory, or nonvolatile random-access memory (RAM) (e.g., ferroelectric RAM (FeRAM). Volatile memory 1320 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1312 can also include removable/non-removable, volatile/non-volatile computer storage media. FIG. 13 illustrates, for example, a disk storage 1324. Disk storage 1324 can also include, but is not limited to, devices like a magnetic disk drive, floppy disk drive, tape drive, Jaz drive, Zip drive, LS-100 drive, flash memory card, or memory stick. The disk storage 1324 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1324 to the system bus 1318, a removable or non-removable interface is typically used, such as interface 1326. FIG. 13 also depicts software that acts as an intermediary between users and the basic computer resources described in the suitable operating environment 1301. Such software can also include, for example, an operating system 1328. Operating system 1328, which can be stored on disk storage 1324, acts to control and allocate resources of the computer 1312. System applications 1330 take advantage of the management of resources by operating system 1328 through program modules 1332 and program data 1334, e.g., stored either in system memory 1316 or on disk storage 1324. It is to be appreciated that this disclosure can be implemented with various operating systems or combinations of operating systems. A user enters commands or information into the computer 1312 through input device (s) 1336. Input devices 1336 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1314 through the system bus 1318 via interface port(s) 1338. Interface port(s) 1338 include, for example, a serial port, a parallel port, a game port, and a universal serial bus (USB). Output device (s) 1340 use some of the same type of ports as input device(s) 1336. Thus, for example, a USB port can be used to provide input to computer 1312, and to output information from computer 1312 to an output device 1340. Output adapter 1342 is provided to illustrate that there are some output devices 1340 like monitors, speakers, and printers, among other output devices 1340, which require special adapters. The output adapters 1342 include, by way of illustration and not limitation, video and sound cards that provide a means of connection between the output device 1340 and the system bus 1318. It should be noted that other devices and/or systems of devices provide both input and output capabilities such as remote computer(s) 1344.

Computer 1312 can operate in a networked environment using logical connections to one or more remote computers, such as remote computer(s) 1344. The remote computer(s) 1344 can be a computer, a server, a router, a network PC, a workstation, a microprocessor based appliance, a peer device or other common network node and the like, and typically can also include many or all the elements described relative to computer 1312. For purposes of brevity, only a memory storage device 1346 is illustrated with remote computer(s) 1344. Remote computer(s) 1344 is logically connected to computer 1312 through a network interface 1348 and then physically connected via communication connection 1350. Network interface 1348 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1350 refers to the hardware/software employed to connect the network interface 1348 to the system bus 1318. While communication connection 1350 is shown for illustrative clarity inside computer 1312, it can also be external to computer 1312. The hardware/software for connection to the network interface 1348 can also include, for exemplary purposes only, internal and external technologies such as, modems including regular telephone grade modems, cable modems and DSL modems, ISDN adapters, and Ethernet cards.

Embodiments of the present innovation may be a system, a method, an apparatus and/or a computer program product at any possible technical detail level of integration. The computer program product can include a computer readable storage medium (or media) having computer readable program instructions thereon for causing a processor to carry out aspects of the present innovation. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of various aspects of the present innovation can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to customize the electronic circuitry, to perform aspects of the present innovation.

Aspects of the present innovation are described herein with reference to flowchart illustrations and/or block diagrams of methods, apparatus (systems), and computer program products according to embodiments of the innovation. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present innovation. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that executes on a computer and/or computer, those skilled in the art will recognize that this disclosure also can or can be implemented in combination with other program modules. Generally, program modules include routines, programs, components, data structures, etc. that perform tasks and/or implement abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a server computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems, computer program products, and computer-implemented methods. It is, of course, not possible to describe every conceivable combination of components, products and/or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device, comprising:
   a substrate having a first pattern; and a layer formed on the substrate and comprising an ultra-low-k dielectric film having a second pattern, wherein the second pattern comprises one or more open regions causing the first pattern of the substrate to be visible through the one or more open, unfilled regions, wherein a first one of the one or more open regions of the second pattern is wholly enclosed in an interior area of the layer, and wherein a second one of the one or more open regions of the second pattern comprises spacer material separating an interior region of the second one of the one or more open regions into at least two portions.

2. The semiconductor device of claim 1, wherein the first pattern is orthogonal to the second pattern.

3. The semiconductor device of claim 1, wherein the second pattern has a thickness 40-150 nanometers (nm).

4. The semiconductor device of claim 1, wherein the substrate is composed of copper.

5. The semiconductor device of claim 1, wherein the at least one of the one or more open regions of the second pattern is wholly enclosed in an interior area of the layer that is non-contiguous with an outer edge of the layer.

6. The semiconductor device of claim 1, wherein the k of the ultra-low-k dielectric material is 2.0-4.0.

7. The semiconductor device of claim 1, wherein the substrate is a bottom layer of the semiconductor device and wherein the layer is a top layer of the semiconductor device.

8. The semiconductor of claim 1, wherein the first one of the one or more open regions of the second pattern is a single uninterrupted open region and wherein the second one of the one or more open regions is distinct from the first one of the one or more open regions.

* * * * *